United States Patent
Kusano et al.

(10) Patent No.: US 10,901,040 B2
(45) Date of Patent: Jan. 26, 2021

(54) BATTERY STATE ESTIMATING DEVICE

(71) Applicant: DENSO CORPORATION, Kariya (JP)

(72) Inventors: Yoshikazu Kusano, Kariya (JP); Koji Ohira, Kariya (JP); Naomi Awano, Kariya (JP)

(73) Assignee: DENSO CORPORATION, Kariya (JP)

( * ) Notice: Subject to any disclaimer, the term of this patent is extended or adjusted under 35 U.S.C. 154(b) by 199 days.

(21) Appl. No.: 15/921,312

(22) Filed: Mar. 14, 2018

(65) Prior Publication Data
US 2018/0267106 A1 Sep. 20, 2018

(30) Foreign Application Priority Data
Mar. 14, 2017 (JP) .................. 2017-048001

(51) Int. Cl.
*G01R 31/382* (2019.01)
(52) U.S. Cl.
CPC ................... *G01R 31/382* (2019.01)
(58) Field of Classification Search
None
See application file for complete search history.

(56) References Cited

U.S. PATENT DOCUMENTS

2002/0196026 A1* 12/2002 Kimura .............. G01R 31/3828
324/426
2007/0188146 A1 8/2007 Nakano et al.
2009/0134843 A1* 5/2009 Mizuno ................ G01R 31/382
320/134
2010/0085057 A1 4/2010 Nishi et al.
2013/0067256 A1 3/2013 Shiraishi
2014/0298045 A1* 10/2014 Sieber ..................... G06F 1/263
713/300

FOREIGN PATENT DOCUMENTS

JP 2000-294299 A 10/2000

* cited by examiner

*Primary Examiner* — Paresh Patel
(74) *Attorney, Agent, or Firm* — Oliff PLC

(57) ABSTRACT

A battery state estimating device periodically estimates a battery state of a secondary battery. The battery state estimating device has a current amount acquiring section, a threshold amount memory, a current amount comparing section, a cycle setting section, and a battery state estimating section. The current amount acquiring section acquires a current amount flowing in the secondary battery. At least one current threshold amount is stored in advance in the threshold amount memory. The current amount comparing section compares the current amount acquired by the current amount acquiring section with the current threshold amount stored in the threshold amount memory. The cycle setting section sets an estimation cycle for estimating the state of the secondary battery based on this comparison result. The battery state estimating section periodically estimates the battery state of the secondary battery based on the estimation cycle set by the cycle setting section.

6 Claims, 5 Drawing Sheets

BATTERY STATE ESTIMATING DEVICE

CROSS-REFERENCE TO RELATED APPLICATION

This application is based on and claims the benefit of priority from earlier Japanese Patent Applications No. 2017-48001 filed Mar. 14, 2017, the descriptions of which are incorporated herein by references.

TECHNICAL FIELD

The present disclosure relates to a battery state estimating device.

BACKGROUND

Conventionally, there is a device that performs a calculation using an electrochemical model of a secondary battery as a device for estimating a battery state of a secondary battery.

Since such a computation has a relatively high calculation load, power consumption in a computation unit of the device is high.

Therefore, in a configuration disclosed in Japanese Patent Application Laid-Open Publication No. 2008-243373 (Patent Document 1), the calculation load is reduced by incorporating a linear approximation formula in the electrochemical model.

However, in the configuration disclosed in Patent Document 1, since linear approximation formula is used, estimation accuracy may decrease, and the estimation accuracy may become remarkably deteriorated depending on the way the secondary battery is used.

SUMMARY

An embodiment provides a battery state estimating device capable of estimating a battery state of a secondary battery with high accuracy with low power consumption.

One aspect of the present disclosure is a battery state estimating device for periodically estimating a battery state of a secondary battery including a current amount acquiring section that acquires a current amount flowing in the secondary battery, a threshold amount memory in which at least one current threshold amount is stored in advance, a current amount comparing section for comparing the current amount acquired by the current amount acquiring section with the current threshold amount stored in the threshold amount memory, a cycle setting section that sets an estimation cycle which is a cycle for estimating the state of the secondary battery based on a comparison result of the current amount comparing section, and a battery state estimating section that periodically estimates the battery state of the secondary battery based on the estimation cycle set by the cycle setting section.

An ease of battery reaction in the secondary battery varies depending on the amount of the current flowing through the secondary battery.

Further, in the battery state estimating device, an estimation cycle of the state of the secondary battery is set based on the result of comparing the current amount flowing in the secondary battery and the current threshold amount stored in the threshold amount memory.

Thus, it is possible to adjust the calculation load in the battery state estimation section by setting the estimation cycle of the secondary battery in consideration of the ease with which the battery reaction in the secondary battery progresses.

As a result, while maintaining the calculation accuracy, the power consumption can be reduced in the battery state estimating section compared with a case where the battery state estimating section constantly performs calculation with a high calculation load at all times without considering the progress of the battery reaction in the secondary battery.

As described above, according to the present disclosure, it is possible to provide a battery state estimating device that can estimate a battery state of a secondary battery with high accuracy with low power consumption.

DETAILED DESCRIPTION OF THE PREFERRED EMBODIMENTS

First Embodiment

An embodiment of a battery state estimating device will be described with reference to FIGS. 1 to 3.

Figure 1:
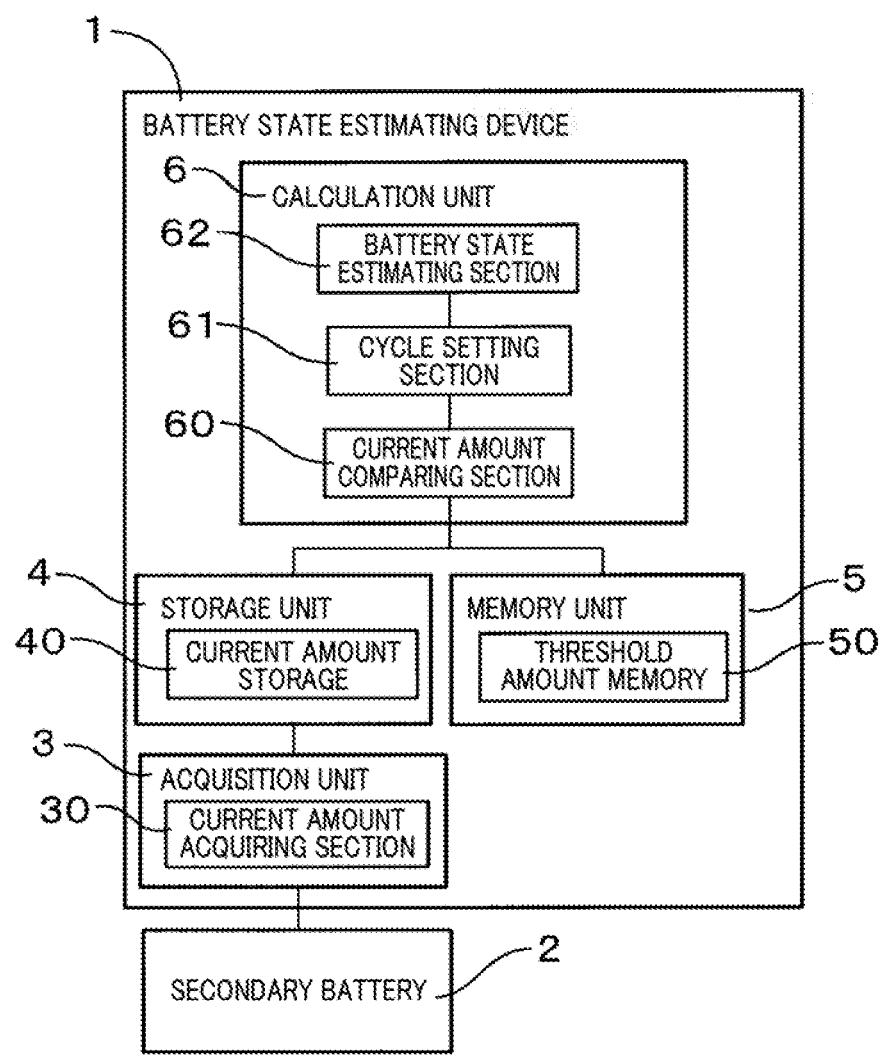
FIG. 1 shows a block diagram of a configuration of a battery state estimating device in a first embodiment.

As shown in FIG. 1, a battery state estimating device 1 of the present embodiment periodically estimates a battery state of a secondary battery 2.

The battery state estimating device 1 includes a current amount acquiring section 30, a threshold memory 50, a current amount comparing section 60, a cycle setting section 61, and a battery state estimating section 62.

The current amount acquiring section 30 acquires a current amount flowing in the secondary battery 2.

At least one current threshold amount is stored in advance in the threshold amount memory 50.

The current amount comparing section 60 compares the current amount acquired by the current amount acquiring section 30 with the current threshold amount stored in the threshold amount memory 50.

The cycle setting section 61 sets an estimation cycle which is a cycle for estimating the state of the secondary battery 2 based on a comparison result of the current amount comparing section 60.

The battery state estimating section 62 periodically estimates the battery state of the secondary battery 2 based on the estimation cycle set by the cycle setting section 61.

Hereinafter, the battery state estimating device 1 of the present embodiment will be described in detail.

The battery state estimating device 1 shown in FIG. 1 is for estimating the battery state of the secondary battery 2 mounted on a battery control unit in a vehicle such as an electric vehicle.

The battery state estimating device 1 includes an acquisition unit 3, a storage unit 4, a memory unit 5, and a calculation unit 6.

As shown in FIG. 1, the acquisition unit 3 includes the current amount acquiring section 30.

The current amount acquiring section 30 is composed of an ammeter, connected to the secondary battery 2, and detects a current amount flowing in the secondary battery 2.

The timing for acquiring the current amount is not particularly limited, and may be performed always or at predetermined intervals or may be acquired in accordance with an estimation cycle (described later).

As shown in FIG. 1, the storage unit 4 has a current amount storage 40.

The current amount storage 40 is composed of a rewritable nonvolatile memory and stores the current amount acquired by the current amount acquiring section 30.

As shown in FIG. 1, the memory unit 5 has the threshold memory 50.

The threshold amount memory 50 is composed of a non-rewritable nonvolatile memory, and at least one current threshold amount is stored in advance.

In the present embodiment, the current amount in the secondary battery 2 when the vehicle on which the secondary battery 2 is mounted is idle-stopping is stored in advance as the current threshold amount.

As shown in FIG. 1, the calculation unit 6 includes the current amount comparing section 60, the cycle setting section 61, and the battery state estimating section 62.

The calculation unit 6 is configured to be capable of executing a program that functions as the current amount comparing section 60, the cycle setting section 61, and the battery state estimating section 62.

The program is stored in a memory (not shown) provided in the calculation unit 6.

The current amount comparing section 60 shown in FIG. 1 extracts the current amount stored in the current amount storage 40, extracts the current threshold amount stored in the threshold amount memory 50, and both are compared.

In a case where a plurality of current amounts are stored in the current amount storage 40, the current amount comparing section 60 can extract, for example, the latest current amount.

Further, in a case where a plurality of current threshold amounts are stored in the threshold amount memory 50, the current amount comparing section 60 can extract all of the plurality of current threshold amounts.

Furthermore, the current threshold amounts extracted by the current amount comparing section 60 may be configured so that a user can select them, and one or more current threshold amounts selected by the user may be extracted.

In a case where the current amount comparing section 60 extracts a plurality of current threshold amounts, the current amount comparing section 60 compares all of the extracted plurality of current threshold amounts with the current amount extracted from the current amount storage 40.

Timing at which the current amount comparing section 60 performs the comparison can be set for each estimation cycle (described later).

In the present embodiment, the current amount comparing section 60 compares the absolute value of the current amount extracted from the current amount storage 40 with the current threshold amount, and indicates relative magnitudes of the absolute value of the current amount and the current threshold amount as a comparison result.

The cycle setting section 61 shown in FIG. 1 sets an estimation cycle for estimating the state of the secondary battery 2 based on the comparison result of the current amount comparing section 60.

An initial value can be set in advance as an estimation cycle.

Then, for example, when the comparison result of the current amount comparing section 60 indicates that the absolute value of the current amount extracted by the current amount comparing section 60 is smaller than the current threshold amount extracted by the current amount comparing section 60, the cycle setting section 61 can the estimation cycle set longer than the initial value.

Further, when the comparison result of the current amount comparing section 60 indicates that the current amount extracted by the current amount comparing section 60 is not smaller than the current threshold amount extracted by the current amount comparing section 60, the cycle setting section 61 can set so as to maintain the initial value without changing the estimation cycle.

Then, the battery state estimating section 62 periodically estimates the battery state of the secondary battery 2 based on the estimation cycle set by the cycle setting section 61.

The battery state of the secondary battery 2 estimated by the battery state estimating section 62 is not particularly limited, and it is possible to estimate a state of charge (SOC), an input/output power, a chargeable/dischargeable electric energy, an input/output resistance, etc. in the secondary battery 2.

Next, a use mode in the battery state estimating device 1 will be described with reference to the flowchart shown in FIG. 2.

Figure 2:
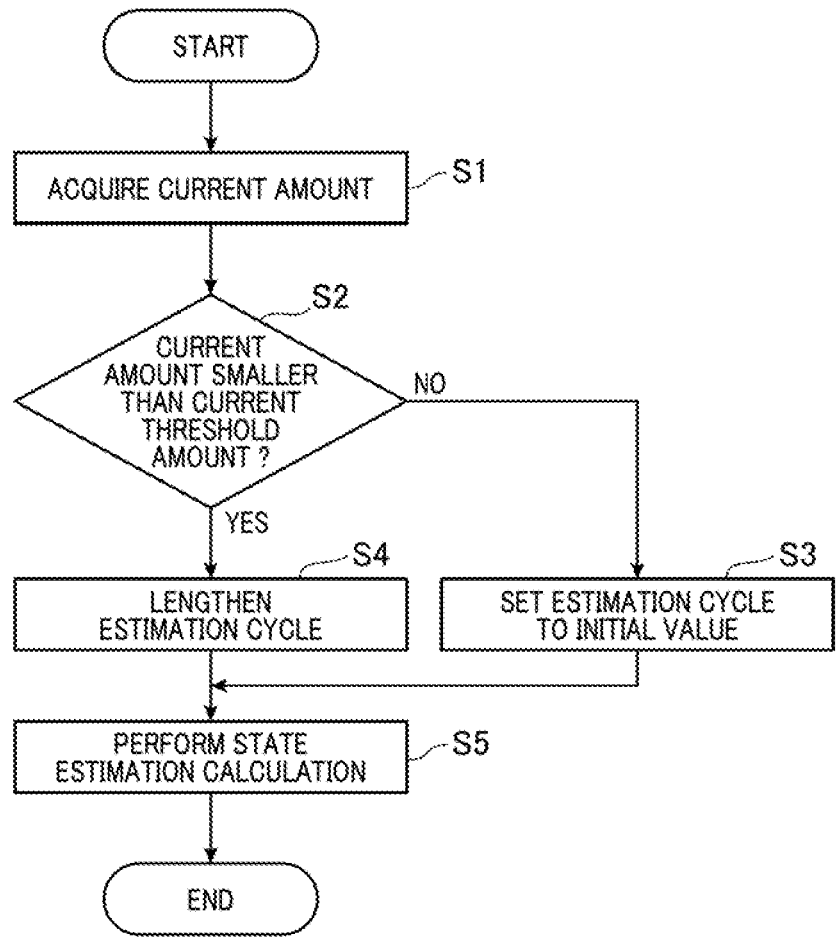
FIG. 2 shows a flowchart of a control mode of the battery state estimating device in the first embodiment.

First, as shown in FIG. 2, in step S1, the current amount acquiring section 30 acquires a current amount of the secondary battery 2.

Then, the acquired current amount is stored in the current amount storage 40.

Figure 3:
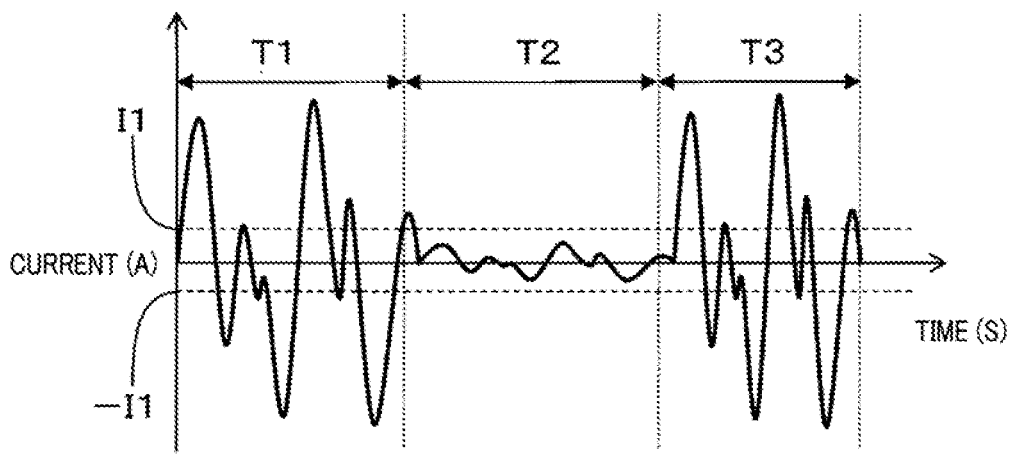
FIG. 3 shows a conceptual diagram of a current amount flowing in the secondary battery in the first embodiment.

As shown in FIG. 3, the current amount acquiring section 30 always acquires the current amount flowing through the secondary battery 2 in the present embodiment.

Thereafter, as shown in FIG. 2, in step S2, the current amount comparing section 60 extracts the latest current amount stored in the current amount storage 40 and extracts the current threshold amount stored in the threshold amount memory 50, and both are compared.

In the present embodiment, the absolute value of the current amount stored in the current amount storage 40 is compared with the current amount in the secondary battery 2 when the vehicle is idle-stopping as the current threshold amount.

Then, the relative magnitudes of the absolute value of the current amount and the current threshold amount is indicated as a comparison result by the current amount comparing section 60.

Then, in a case where the comparison result of the current amount comparing section 60 indicates that the absolute value of the current amount is not smaller than the current threshold amount, that is, when the current threshold amount is I1 in FIG. 3, the first interval T1 and the third interval T3, the process proceeds to No in step S2 as shown in FIG. 2, and in step S3, the estimation cycle set in the cycle setting section 61 is set to an initial value.

Note that if the estimation cycle is already the initial value, the initial value is maintained without any change.

Thereafter, in step S5, the battery state estimating section 62 periodically estimates the battery state of the secondary battery 2 based on the estimated period of the initial value, and ends the process.

On the other hand, in step S2, in a case where the comparison result of the current amount comparing section 60 indicates that the absolute value of the current amount is smaller than the current threshold amount, that is, in a state shown in the second section T2 in FIG. 3, the cycle setting section 61 sets the estimation cycle longer than the initial value in step S4, as shown in FIG. 2.

Thereafter, in step S5, the battery state estimating section 62 periodically estimates the battery state of the secondary battery 2 based on the estimation cycle set longer than the initial value in step S3, and ends the process.

Note that after step S5, the process may return to step S1 again.

In this case, in a case where the current amount is smaller than the current threshold amount in step S2 again, and in a case where the previous step S4 is being executed, the present estimation cycle is maintained without performing step S4 again, and the process can proceed to step S5.

Note that in a case where an ignition switch of an engine is turned off, the current amount acquired by the current amount acquiring section 30 in step S1 in FIG. 2 is set to 0, then the process proceeds to step S2, and in step S2, the current amount is assumed to be smaller than the current threshold amount, and the process can proceed to step S4.

Next, functions and effects of the battery state estimating device 1 of the present embodiment will be described in detail.

In the battery state estimating device 1, the estimating cycle of the state of the secondary battery 2 is set based on the result of comparing the current amount flowing in the secondary battery 2 with the current threshold amount stored in the threshold amount memory 50.

Thereby, it is possible to adjust a calculation load in the battery state estimating section 62 by setting the estimation cycle of the secondary battery 2 in consideration of the ease of battery reaction in the secondary battery 2.

As a result, it is possible to reduce power consumption while maintaining calculation accuracy in the battery state estimating section 62 as compared with a case where the battery state estimating section 62 constantly performs calculation with a high calculation load at all times without considering the progress of the battery reaction in the secondary battery 2.

In the present embodiment, the current amount comparing section 60 compares the absolute value of the current amount acquired by the current amount acquiring section 30 with the current threshold amount stored in the threshold amount memory 50.

Then, in the case where the comparison result of the current amount comparing section 60 indicates that the absolute value of the current amount is smaller than the current threshold amount, the cycle setting section 61 sets the estimation cycle to be longer.

In the state where the absolute value of the current amount is smaller than the current threshold amount, the battery reaction in the secondary battery 2 proceeds slowly, therefore, even if the estimation cycle is made longer, it is possible to reduce the calculation load in the estimating section 62 while maintaining the estimation accuracy in the battery state estimating section 62.

Further, in the present embodiment, the secondary battery 2 is provided in the vehicle, and the current amount in the secondary battery 2 when the vehicle is idle-stopping is stored in the threshold amount memory 50 in advance as the current threshold amount.

Since the current amount in the secondary battery 2 when the vehicle is idle-stoppings is low, the battery reaction in the secondary battery 2 proceeds slowly.

Therefore, by setting the current amount in the secondary battery 2 at the time of idle-stopping as the current threshold amount stored in the threshold amount memory 50, the calculation load in the battery state estimating section 62 can be reduced while maintaining the estimation accuracy in the battery state estimating section 62.

As described above, according to the present embodiment, it is possible to provide the battery state estimating device 1 that can estimate the battery state of the secondary battery 2 with high accuracy with low power consumption.

Note that the current amount comparing section 60 adopts the latest current amount stored in the current amount storage 40 as a current amount to be compared with the current threshold amount in the present embodiment.

Alternatively, an average current amount of the predetermined period including the latest current amount stored in the current amount storage 40 may be a current amount to be compared with the current threshold amount. It should be noted that the battery state estimating device 1 may have a cycle storage in which a plurality of estimation cycles having different lengths are stored in advance as the estimation cycle, and the period setting section 61 may set the estimation cycle by extracting an estimation cycle of a predetermined length from the cycle storage based on the comparison result of the current amount comparing section 60.

Note that it is assumed that the current amount in the secondary battery 2 when the vehicle on which the secondary battery 2 is mounted is idle-stopping is stored in advance in the threshold amount memory 50 as the current threshold amount in the present embodiment.

Alternatively, in a first modification, a current amount in a secondary battery 2 when the secondary battery 2 is not charging/discharging is stored in advance in a threshold memory 50 as a current threshold amount.

Other configurations in the first modification are the same to those in the first embodiment.

In the first modification, a estimation cycle by the battery state estimating device 1 is lengthened in a state in which the secondary battery 2 is not charging/discharging, that is, in a state in which the secondary battery 2 is in a resting state.

Since progress of the battery reaction is very slow when the secondary battery 2 is at rest, lengthening the estimation cycle makes it possible to reduce the calculation load and the power consumption while maintaining the estimation accuracy.

Then, in the first modification, the same functions and effects as those of the first embodiment are obtained.

Further, as a second modification, a current amount in a secondary battery 2 at the time when electrical power is supplied from an external source to the secondary battery 2 and charged is stored in the threshold memory 50 in advance.

Figure 4:
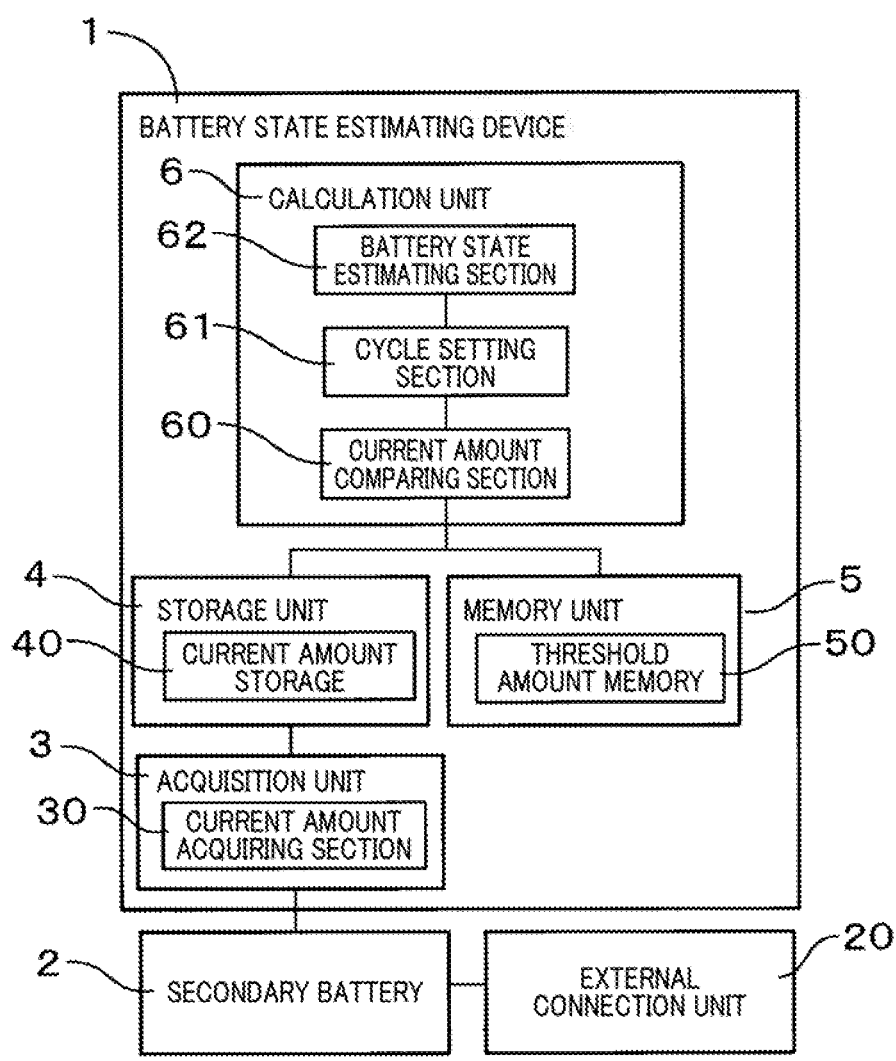
FIG. 4 shows a block diagram of a configuration of a battery state estimating device in a second modification.

Then, in a battery state estimating device 1 of the second modification, as shown in FIG. 4, the secondary battery 2 is connected to an external connection unit 20.

The external connection unit 20 is provided in a vehicle on which the secondary battery 2 is mounted, and is configured to be connectable to a power supply device (not shown) outside the vehicle.

The secondary battery 2 is configured to be charged from the power supply device via the external connection unit 20.

Other constituent elements in the second modification are the same as those in the first embodiment, and in the second modification, the same reference numerals as those in the first embodiment are used and explanations thereof are omitted.

In the second modification, an estimation cycle by the battery state estimating device 1 is lengthened in a state in which the secondary battery 2 is being charged.

Since progress of a battery reaction of the secondary battery 2 during charging is very slow, by increasing the estimation cycle, it is possible to reduce the calculation load and reduce the power consumption while maintaining the estimation accuracy.

Then, also in the present modification, the same functions and effect as in the first embodiment can be obtained.

Second Embodiment

Figure 5:
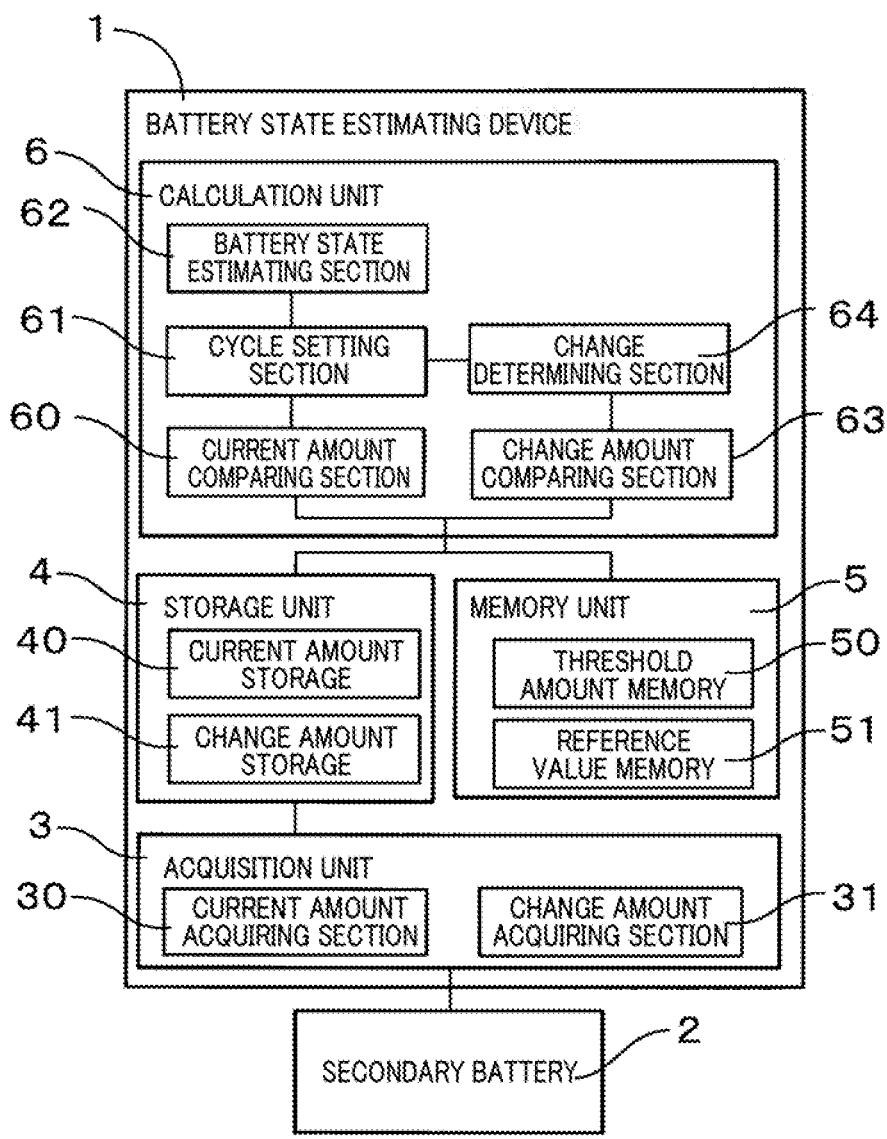
FIG. 5 shows a block diagram of a configuration of a battery state estimating device in a second embodiment.

In a battery state estimating device 1 according to a second embodiment, as shown in FIG. 5, in addition to the configuration of the first embodiment shown in FIG. 1, the acquisition unit 3 has a change amount acquiring section 31, the storage unit 4 has a change amount storage 41, the memory unit 5 has a reference value memory 51, and the calculation unit 6 has a change amount comparing section 63 and a change determining section 64.

Other constituent elements are the same as those in the first embodiment, and the same reference numerals as those in the first embodiment are also used in the present embodiment, and the description thereof is omitted.

The change amount acquiring section 31 shown in FIG. 5 is configured to acquire the change amount of the battery state of the secondary battery 2.

In the present embodiment, the change amount acquiring section 31 includes a voltmeter that detects a voltage as an output amount of the secondary battery 2.

Although the timing at which the change amount acquiring section 31 detects the output amount is not particularly limited, the output amount may be detected for each estimation cycle so that the change amount acquiring section 31 can acquire the change amount for each estimation cycle.

It should be noted that the calculation unit 6 includes a change amount calculating section (not shown), and the change amount calculating section calculates the change amount from the output amount detected by the change amount acquiring section 31 in the present embodiment.

Then, the change amount storage 41 shown in FIG. 5 is composed of a rewritable nonvolatile memory, and stores the change amounts acquired by the change amount acquiring section 31.

The reference value memory 51 shown in FIG. 5 stores in advance the reference value of the change amount to be used in the change amount comparing section 63 (described later).

In the present embodiment, a value corresponding to the change amount of the output amount when the output amount of the secondary battery 2 becomes excessively large is stored as a reference value.

The change amount comparing section 63 shown in FIG. 5 compares the change amount acquired by the change amount acquiring section 41 with a preset reference value.

The change amount is extracted from the change amount storage 41.

In a case where a plurality of change amounts are stored in the change amount storage 41, the change amount comparing section 63 can extract, for example, the latest change amount.

Further, in a case where a plurality of change amounts are stored in the reference value memory 51, the change amount comparing section 63 can extract all of the plurality of change amounts.

Furthermore, the reference values extracted by the change amount comparing section 63 are configured so that a user can select them, and one or more reference values selected by the user can be extracted.

In a case where the modification comparator 63 extracts a plurality of reference values, the modification comparator 63 compares all of the extracted plurality of reference values with the change amount extracted from the change amount storage 41.

Timing at which the change amount comparing section 63 performs the comparison can be set for each estimation cycle.

In the present embodiment, the change amount comparing section 63 compares the change amount extracted from the change amount storage 41 with the reference value, and indicates relative magnitudes of the change amount and the reference value as a comparison result.

The change determining section 64 shown in FIG. 5 determines whether or not to change the estimation cycle based on the comparison result of the change amount comparing section 63.

In the present embodiment, in a case where the comparison result of the change amount comparing section 63 indicates that the change amount extracted from the change amount storage 41 is larger than the reference value, the change determining section 64 determines whether the estimation cycle is changed to be shortened, and if not, it determines that the estimation cycle is not changed.

Then, the cycle setting section 61 sets the estimation cycle based on the determination result of the change determining section 64.

Next, a use mode of the battery state estimating device 1 according to the second embodiment will be described with reference to the flowchart shown in FIG. 6.

Figure 6:
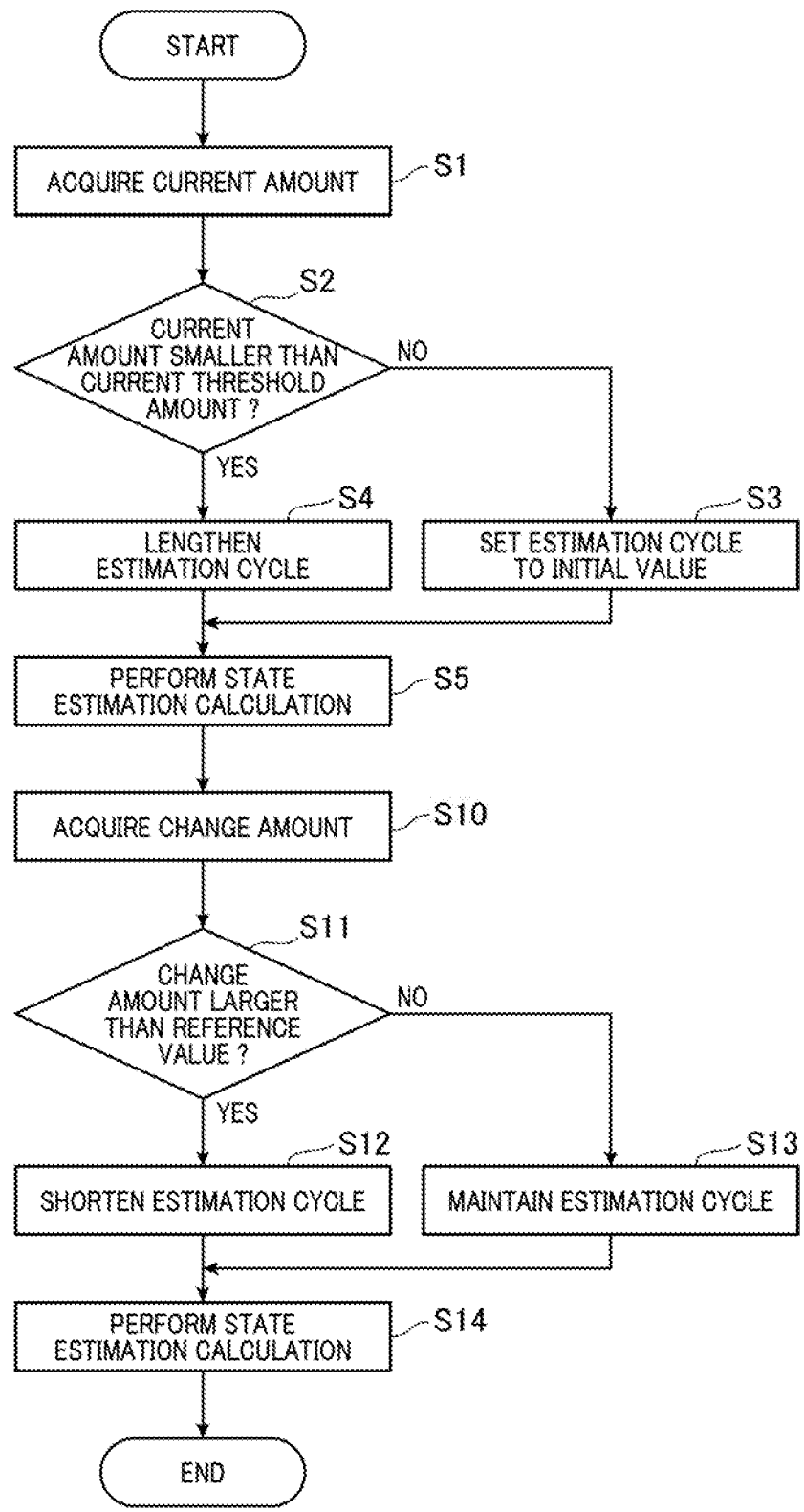
FIG. 6 shows a flowchart of a control mode of the battery state estimating device in the second embodiment.

First, as in the case of the first embodiment shown in FIG. 2, steps S1 to S5 are carried out as shown in FIG. 6.

As shown in FIG. 6, after the execution of step S5, in step S10, the change amount acquiring section 31 acquires the change amount of the output amount in the secondary battery 2.

Then, the acquired change amount is stored in the change amount storage 41.

Thereafter, in step S11, the change amount comparing section 63 extracts the change amount stored in the change amount storage 41 and extracts the reference value stored in the reference value memory 51, and both are compared.

Then, the change amount comparing section 63 indicates the relative magnitudes of the change amount of the output amount and the reference value as the comparison result.

Then, in a case where the comparison result of the change amount comparing section 63 indicates that the change amount of the output amount is larger than the reference value, the process proceeds to Yes in step S11, and in step S12, the cycle setting section 61 sets the estimation cycle to be shorter.

Thereafter, in step S14, the battery state estimating section 62 periodically estimates the battery state of the secondary battery 2 based on the estimation cycle shortened in step S12, and ends the process.

On the other hand, in a case where the comparison result of the change amount comparing section 63 indicates that the change amount of the output amount is not larger than the reference value in step S11, the process proceeds to No in step S11, and in step S13, the estimated cycle is maintained in the cycle setting section 61 without any change.

Thereafter, in step S14, the battery state estimating section 62 periodically estimates the battery state of the secondary battery 2 based on the estimation cycle maintained in step S13, and ends the process.

It should be noted that after step S14, the process may return to step S1 again as in the case of the first embodiment.

In this case, in a case where the comparison result indicates that the change amount is larger than the reference value in step S11 again, and in a case where the previous step S12 is being executed, the current estimation cycle is maintained without performing step S12 again, and the process can proceed to step S14.

According to the battery state estimating device 1 of the second embodiment, in the case where the change amount of the output amount of the secondary battery 2 is excessively large, the estimation cycle is shortened.

In the case where the change amount of the output amount of the secondary battery 2 is excessively large, it is considered that the state change due to the battery reaction of the secondary battery 2 in the cycle is large, thus by shortening the estimation cycle, the detection accuracy of the battery state is improved so that the battery state of the secondary battery 2 can be more accurately estimated.

Further, since the estimation cycle is shortened when the output amount of the secondary battery 2 is excessively large after lengthening the estimation cycle of the battery state of the secondary battery 2 in the present embodiment, it is possible to reduce the calculation load and the calculation accuracy can be improved.

Moreover, the same functions and effects as in the case of the first embodiment can be obtained in the present embodiment as well.

It should be noted that when the estimation cycle is lengthened after shortening the estimation cycle of the battery state of the secondary battery 2, the estimation cycle may be returned to the initial value or may be set to a length different from the initial value.

According to a battery state estimating device 1 of such a modification, when a change amount of a terminal voltage of a secondary battery 2 becomes excessively large and it is therefore considered that a state change due to a battery reaction of the secondary battery 2 in that cycle is large, such a modification also exhibits the same functions and effects as the present embodiment.

Further, in this modification, the same functions and effects as those of the first embodiment can be obtained as well.

The present disclosure is not limited to each of the above-described embodiments, and can be applied to various embodiments without departing from the scope thereof.

For example, among the current amount that the threshold amount memory 50 stores when the vehicle in the first embodiment is idle-stopping, the current amount that the threshold amount memory 50 stores when being charged from an external source as in the first modification, and the current amount that the threshold amount memory 50 stores in a state where the secondary battery 2 is not charged/discharged as in the second modification, any two or all of them may be stored in advance.

Further, it is also possible to adopt a configuration in which the configurations of the first embodiment, the second embodiment and the first and second modifications are arbitrarily combined.

What is claimed is:

1. A battery state estimating device for periodically estimating a battery state of a secondary battery, comprising:
   a current amount acquiring section that acquires a current amount flowing in the secondary battery;
   a threshold amount memory in which at least one current threshold amount is stored in advance;
   a current amount comparing section for comparing the current amount acquired by the current amount acquiring section with the current threshold amount stored in the threshold amount memory;
   a cycle setting section that sets an estimation cycle which is a cycle for estimating the state of the secondary battery based on a comparison result of the current amount comparing section; and
   a battery state estimating section that periodically estimates the battery state of the secondary battery based on the estimation cycle set by the cycle setting section, wherein the battery state estimating device further includes:
   a change amount acquiring section that acquires a change amount of the battery state of the secondary battery for each of the estimation cycles;
   a change amount comparing section that compares the change amount acquired by the change amount acquiring section with a preset reference value; and
   a change determining section that determines whether or not to change the estimation cycle based on the comparison result of the change amount comparing section; wherein
   the cycle setting section sets an estimation cycle based on a determination result of the change determining section.

2. A battery state estimating device for periodically estimating a battery state of a secondary battery, comprising:
   a current amount acquiring section that acquires a current amount flowing in the secondary battery;
   a threshold amount memory in which at least one current threshold amount is stored in advance;
   a current amount comparing section for comparing the current amount acquired by the current amount acquiring section with the current threshold amount stored in the threshold amount memory;
   a cycle setting section that sets an estimation cycle which is a cycle for estimating the state of the secondary battery based on a comparison result of the current amount comparing section; and
   a battery state estimating section that periodically estimates the battery state of the secondary battery based on the estimation cycle set by the cycle setting section, wherein
   the comparing section compares an absolute value of the current amount acquired by the current amount acquiring section with the current threshold amount stored in the threshold amount memory; and
   the cycle setting section sets the estimation cycle to be longer in a case where a comparison result of the comparing section indicates that the absolute value of the current amount is smaller than the current threshold amount.

3. The battery state estimating device according to claim 1, wherein
   the secondary battery is provided in a vehicle; and
   a current amount in the secondary battery when the vehicle is idle-stopping is stored in advance in the threshold amount memory as one of current threshold amounts.

4. The battery state estimating device according to claim 2, wherein
a current amount in the secondary battery when the secondary battery is not charging/discharging is stored in advance in the threshold amount memory as one of current threshold amounts.

5. The battery state estimating device according to claim 1, wherein
the change determining section determines to shorten the estimation cycle in a case where the comparison result of the change amount comparing section indicates that the change amount acquired by the change amount acquiring section is larger than the reference value.

6. The battery state estimating device according to claim 1, wherein
the change amount acquired by the change amount acquiring section is a change amount of an output amount of the secondary battery.

\* \* \* \* \*